United States Patent
Albert et al.

(10) Patent No.: US 6,706,971 B2
(45) Date of Patent: Mar. 16, 2004

(54) STACKABLE MICROCIRCUIT LAYER FORMED FROM A PLASTIC ENCAPSULATED MICROCIRCUIT

(75) Inventors: Douglas M. Albert, Yorba Linda, CA (US); Keith D. Gann, Cypress, CA (US)

(73) Assignee: Irvine Sensors Corporation, Costa Mesa, CA (US)

( * ) Notice: Subject to any disclaimer, the term of this patent is extended or adjusted under 35 U.S.C. 154(b) by 0 days.

(21) Appl. No.: 10/142,557

(22) Filed: May 10, 2002

(65) Prior Publication Data

US 2002/0126459 A1 Sep. 12, 2002

Related U.S. Application Data

(62) Division of application No. 09/770,864, filed on Jan. 26, 2001.

(51) Int. Cl.[7] .................................................. H05K 1/03
(52) U.S. Cl. ...................... 174/255; 174/52.2; 174/251; 361/749; 361/760; 361/767; 361/772; 361/783; 257/686; 257/778; 257/784
(58) Field of Search .................... 174/52.2, 251, 174/255, 267; 361/749, 760, 767, 772, 783; 257/636, 685, 777–780, 783, 784

(56) References Cited

U.S. PATENT DOCUMENTS

| | | | | | |
|---|---|---|---|---|---|
| 4,028,722 A | * | 6/1977 | Helda | ............... | 257/672 |
| 4,889,612 A | * | 12/1989 | Geist et al. | ............... | 204/416 |
| 4,989,063 A | * | 1/1991 | Kolesar, Jr. | ............... | 257/633 |
| 4,994,215 A | * | 2/1991 | Wiech, Jr. | ............... | 264/434 |
| 5,008,213 A | * | 4/1991 | Kolesar, Jr. | ............... | 438/107 |
| 5,086,018 A | * | 2/1992 | Conru et al. | ............... | 29/827 |
| 5,270,673 A | * | 12/1993 | Fries et al. | ............... | 333/246 |
| 5,291,061 A | * | 3/1994 | Ball | ............... | 257/686 |
| 5,585,600 A | * | 12/1996 | Froebel et al. | ............... | 174/52.4 |
| 5,739,581 A | * | 4/1998 | Chillara et al. | ............... | 257/668 |
| 6,080,262 A | * | 6/2000 | Wang | ............... | 156/245 |
| 6,140,695 A | * | 10/2000 | Tandy | ............... | 257/669 |
| 6,307,256 B1 | * | 10/2001 | Chiang et al. | ............... | 257/668 |
| 6,440,835 B1 | * | 8/2002 | Lin | ............... | 438/611 |

* cited by examiner

Primary Examiner—Kamand Cuneo
Assistant Examiner—Jose H. Alcala
(74) Attorney, Agent, or Firm—Myers Dawes Andras & Sherman LLP; Joseph C. Andras

(57) ABSTRACT

A stackable microcircuit layer formed from a plastic encapsulated microcircuit (PEM) and method of making the same is disclosed. The method involves the steps of starting with a commercially available PEM (e.g. a plastic Thin Small Outline Package or TSOP) that contains a microcircuit or die within an encapsulant and modifying the PEM to expose conductive members that are electrically connected to the microcircuit's bond pads. In the case of a TSOP, the preferred modifying step is accomplished by top grinding the TSOP in order to remove the lead frame that was secured above the die and encapsulated along with it in the TSOP. Next, reroute metallization is applied in order to connect the conductive members that were exposed by the top grinding, to an edge of the modified PEM. Finally, if appropriate, the modified PEM is thinned through backside grinding and diced to a desired area, in order to provide a stackable microcircuit layer that may form a part of a dense electronic package. The PEM may be of any suitable type and the stackable microcircuit layers that results from application of this invention may be stacked as provided or included in "neo-chips" that are of greater area, that include additional die, or both. The stackable microcircuit layers made according to this invention beneficially use PEMs that are readily available and that include die that were typically "burned in" by the manufacturer rather than merely tested on a statistical basis as is usually the case with bare die.

6 Claims, 6 Drawing Sheets

STACKABLE MICROCIRCUIT LAYER FORMED FROM A PLASTIC ENCAPSULATED MICROCIRCUIT

This application is a division of Ser. No. 09/770,864 filed Jan. 26, 2001.

BACKGROUND OF THE INVENTION

1. Field of the Invention

This invention relates generally to the dense packaging of electronic circuitry through the stacking of integrated circuit (IC) chips (aka microcircuits or die) and, more specifically, to a stackable microcircuit layer formed from a plastic encapsulated microcircuit and method of making the same

2. Description of the Related Art

A publication titled "Three-Dimensional Electronics Packaging" was issued in November, 1993 by Tech Search International. It describes the 3-D packaging techniques offered by over thirty manufacturers. It includes a table comparing 23 types of packaging in terms of density, manufacturability, flexibility and affordability. The publication also refers to four types of 3-D stacking techniques, one of which is "bare die stacking". It then divides "bare die assembly into standard ICS" and "custom ICs".

The assignee of this application, Irvine Sensors Corporation, has been a leader in developing high density packaging of IC chips, originally for use in focal plane modules, and then for use in a variety of computer functions, such as memory. In the publication cited in the preceding paragraph, Irvine Sensors is listed as a developer of "bare die assemblies" using "custom ICs".

Generally, stacking of IC chips has emphasized use of identical-area chips, each of which performs the same function. The resulting stack is a rectangular parallelepiped (or cube) having substantially planar outer surfaces. One or more of the outer surfaces is an access plane, reached by electrical leads from the IC circuitry of the stacked chips, in order to permit connection to external circuitry.

An early effort to provide a 3-D electronics stack combining different functions, different area electronic chips is illustrated by Kravitz et al., U.S. Pat. No. 3,370,203. That patent shows stacked "frames" having dimensions "such that integrated circuits which have slightly different dimensions can be mounted thereon", explaining that "integrated circuits from different sources of supply are often advantageously incorporated in a single module".

Irvine Sensors' experience with various stacking methods has evolved over time:

Silicon Die Stacking

Irvine Sensors was initially "stacking silicon" by (1) buying whole silicon wafers from a wafer manufacturer, (2) metalizing an upper surface of the wafer to connect each die's bond pads to an edge that will later be formed when the die is diced from the wafer; (3) dicing stackable die from the metallized wafer; (4) stacking the stackable die to form die-stacks, and then (5) forming edge connections on one or more sides of each die stack. Irvine Sensors found it troublesome to make die stacks by stacking silicon die, however, for several reason.

First, it was difficult to buy whole wafers because the wafer manufacturers do not want to reveal their yield or expose their built-in test structures that would make it easier to reverse engineer their circuitry, because the manufacturers do not usually have an existing sales structure for selling whole wafers, and because the manufacturers were concerned about liability issues if the stacked product should come to include a defective die.

Second, it was sometimes difficult to form the edge connects on the die stacks because they must be made within the dicing streets that have grown continually narrower as dicing technologies have improved. For example, the typical dicing street may be 6 mils or less and the saw kerf may be about 1.5 mils with poor registration relative to the die. As a result, a die's original metallization may be undesirably exposed to the edge and thereby make it troublesome to form further access plane metallization along that edge without shorting.

Third, the probability of having a defective die in any one die-stack increases dramatically on the basis of the number of wafers in the wafer stack.

Finally, silicon stacking inherently requires same sized or homogenous die sizes.

Neo-Die Stacking

As a result of the foregoing problems associated with silicon die stacking, Irvine Sensors developed new technology involved creating "Neo-Wafers" and then stacking "Neo-Chips" diced from the Neo-Wafers.

Irvine Sensors has two patents that relate to "Neo-Wafers" and "Neo-Chips", i.e. U.S. Pat. No. 5,953,588 entitled "STACKABLE LAYERS CONTAINING ENCAPSULATED IC CHIPS" and U.S. Pat. No. 6,072,234 entitled "STACK OF EQUAL LAYER NEO-CHIPS CONTAINING ENCAPSULATED IC CHIPS OF DIFFERENT SIZES." The content of these two patents are hereby incorporated by reference in their entirety.

As disclosed more fully in the foregoing patents, the inventors make a "Neo-Wafer" by (1) buying bare die (preferably pre-tested or "known good" die); (2) arranging the bare die in a spaced arrangement within a wafer-shaped fixture; and then (3) pouring a potting material such as epoxy onto the bare die within the wafer-shaped fixture. The Neo-Wafers, after being removed from the fixture, are surface metalized and the potted die are cut from the Neo-Wafers to provide "Neo-Chips" of equal area that are suitable for stacking. A significant benefit of Neo-Wafer and Neo-Chips is that know good die may be used and different sized and number of die may be incorporated into same sized Neo-Chips.

Neo-stacking offers significant improvements over silicon die stacking, but it also proved troublesome under certain market circumstances. In particular, it is often difficult to buy bare die because many manufacturers will only sell only packaged die.

When trying to buy bare DRAM die from a particular manufacturer, for example, it was discovered that the manufacturer would not sell bare DRAM die, but would sell the DRAM die already pre-tested and installed in plastic packages, i.e. as "plastic encapsulated microcircuits" or PEMs. The existing stacking methodologies, however, do not address the stacking of die contained in a plastic encapsulated microcircuit.

There remains a need, therefore, for a stackable microcircuit layer formed from a plastic encapsulated microcircuit and a method of making the same.

SUMMARY OF THE INVENTION

In a first aspect, the invention may be regarded as a method of making a stackable microcircuit layer comprising the steps of: providing a plastic encapsulated microcircuit (PEM) that includes (a) a microcircuit having an active surface containing integrated circuitry and a bond pad, and (b) an encapsulant in contact with the microcircuit; and modifying the PEM to produce a modified PEM having a modified surface on which modified surface is exposed a conductive member that is electrically connected to the bond pad.

In a second aspect, the invention may be regarded as a method of making a stackable microcircuit layer comprising the steps of: providing a plastic encapsulated microcircuit (PEM) that includes: (a) a microcircuit having a bond pad, (b) a conductive lead assembly connected to the bond pad, and (c) a plastic body encapsulating the microcircuit, the bond pad, and at least part of the conductive lead assembly; and grinding a top surface of the PEM to remove a top portion of the plastic body along with at least part of the conductive lead assembly to leave a planar section that contains the microcircuit and the bond pad.

In a third aspect, the invention may be regarded as a method of making a stackable microcircuit layer comprising the steps of: providing a plastic encapsulated microcircuit (PEM) that includes (a) a microcircuit having an active surface containing integrated circuitry and a bond pad, (b) a wire bond connected to the bond pad, a lead frame, and a wire that connects the wire bond to the lead frame, and (d) a plastic body that encapsulates the known-good microcircuit, the wire bond, the wire, and at least a portion of the lead frame; grinding a surface of the PEM to remove the lead frame and the wire and form a modified PEM that contains the microcircuit, the bond pad, and the wire bond, the modified PEM having a modified surface on which modified surface is exposed the wire bond that is connected to the bond pad; and forming an electrical lead on the modified surface that leads from the wire bond to an edge of the modified PEM.

In a fourth aspect, the invention may be regarded as a stackable microcircuit layer comprising: (1) a modified section of a plastic encapsulated microcircuit (PEM) that originally contained (a) a known-good microcircuit having a bond pad, (b) a conductive lead assembly connected to the bond pad, and (c) a plastic body encapsulating the known-good microcircuit, the bond pad, and the conductive lead assembly, the modified section formed by removing a portion of the conductive lead assembly from the PEM; the modified section having a modified surface, the modified section containing the known-good microcircuit, the bond pad, and a remaining portion of the conductive lead assembly with an end thereof exposed on the modified surface; and (2) a reroute lead on the modified surface of the modified section to connect the exposed portion of the remaining portion of conductive lead assembly with an edge of the modified section.

BRIEF DESCRIPTION OF THE DRAWINGS

The just summarized invention can be best understood with reference to the following description taken in view of the drawings of which:

FIG. 4a is a cross-sectional view of the PEM 300 of FIG. 3, taken along section lines 4—4, showing the internal die 210 and a conductive lead assembly 230 contained inside of the encapsulant 310;

FIG. 4b shows a modified PEM or core section 400 having an ablated surface 410 formed by grinding a topside of the PEM 300 of FIG. 4a until the lead frame 270 is removed and end portions of the gold ball bonds 231 are exposed;

FIG. 4c shows the modified PEM 400 after application of metallization 241 that connects the die's bond pad 212, via the end portions of the gold ball bonds 231, with an edge 411 of the modified PEM 400;

FIG. 4d shows the modified PEM 400 after application of an insulating layer 250;

FIG. 4e shows the modified PEM 400 after backside thinning; and

FIG. 4f shows the final stackable microcircuit layer 400* that is formed by reducing the area (if desired) of the modified PEM 400 of FIG. 4e along the dashed lines;

FIG. 7a is an inverted, cross-sectional view of the PEM 600 of FIG. 3 (simplified to show only two solder ball terminals 536), showing the internal die 510 and a conductive lead assembly 530 that is contained inside of the encapsulant 610;

FIG. 7b shows a modified PEM 700 formed by removing the solder ball terminals 536 such that one end 534 of a flexible lead beam 531 is exposed;

FIG. 7c shows the modified PEM 700 after application of metallization 541 that connects the die's bond pad 512, via the flexible lead beam 531 that has one end 533 in contact with the bond pad 512 and another end 534 exposed to the metallization 543, with an edge 711 of the modified PEM 700; and FIG. 7d shows the final stackable microcircuit layer 700* that is formed after application of an insulating layer 550 (there is thinning or reduction in area as in FIGS. 4e and 4f above because the uBGA was thin and chip scale to begin with)

DETAILED DESCRIPTION OF SPECIFIC EMBODIMENTS

In the past, bare die have been potted in special fixtures in order to create stackable microcircuit layers known as "neo-chips". Unfortunately, bare die are not always available and even when they are, the manufacture's testing is often limited to statistical "pass/fail" verifications using parametric measurements and suitable guard bands. The present invention, however, is directed to creating stackable microcircuit layers in a novel "reverse" manner, i.e. by starting with plastic encapsulated microcircuits (PEMs) or, in other words, by starting with already packaged die. There are two significant benefits to starting with PEMs. First, PEMs are readily available for purchase in the marketplace. Second, the die contained in the PEMs are usually pre-tested and fully burned-in by the manufacturer.

Figure 1:
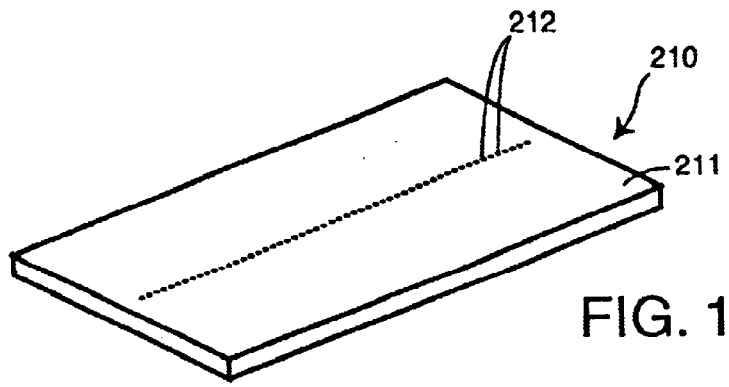
FIG. 1 is a perspective view of a die 210 that may be incorporated in a stackable microcircuit layer according to a preferred embodiment of this invention, the die 210 having an active surface 211 and a plurality its I/O bond pads 212.

FIG. 1 shows, by way of background, a die 210 that includes an active surface 211 containing integrated circuitry and a plurality of bond pads 212. Ordinarily, wires are bonded to the bond pads 212 in order to provide power, communicate control signals, and the like, to and from the circuitry via the leads of a package that suitably contains the die 210. Here, the bond pads 212 are arranged in a straight line down the center of the die 210, but the actual arrangement of bond pads may vary. Dies like that shown in FIG. 1 are carried in all varieties of packages, two of which are discussed below.

Preferred Embodiment—TSOP Package

Figure 2:
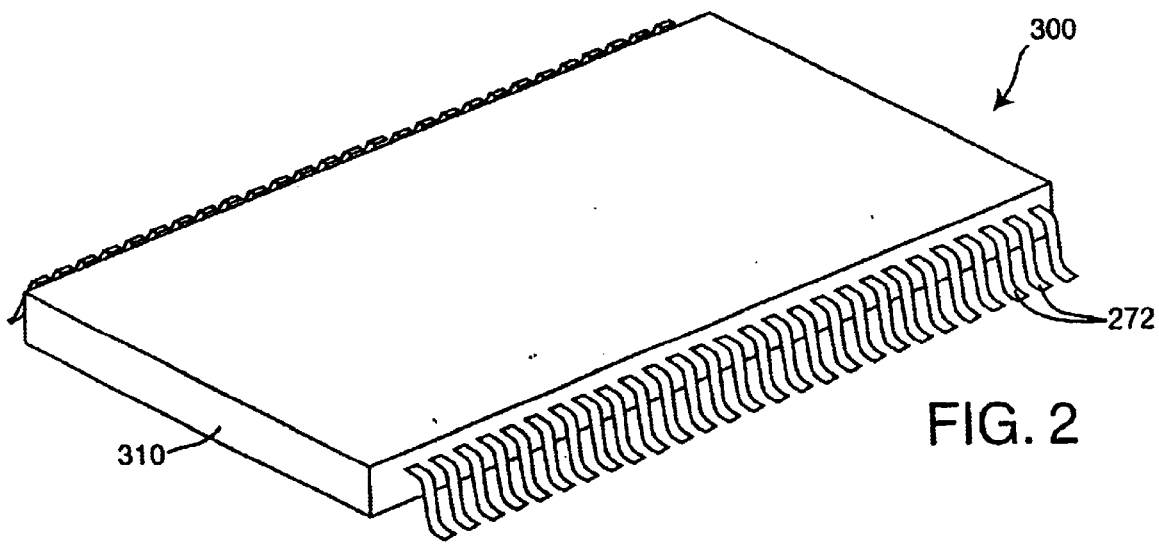
FIG. 2 is a perspective view of a plastic encapsulated microcircuit 300 provided as a 54-pin Thin Small Outline Package ("TSOP") that is formed from an encapsulant 310 that contains a die (not shown here, but see FIG. 3) connected to a lead frame having lead tips 272.

FIG. 2 shows a typical plastic encapsulated microcircuit (PEM) 300 that is formed from a plastic, injection molded encapsulant 310 and may be used to practice this invention. The particular PEM 300 of FIG. 2 is a 54-pin TSOP (Thin Small Outline Package) that has a plurality of leads 272 extending from the encapsulant 310. It should be understood, however, that there are a wide variety of conventional and "chip-scale" package designs that already exist or may be later designed that may be used according to this invention.

Figure 3:
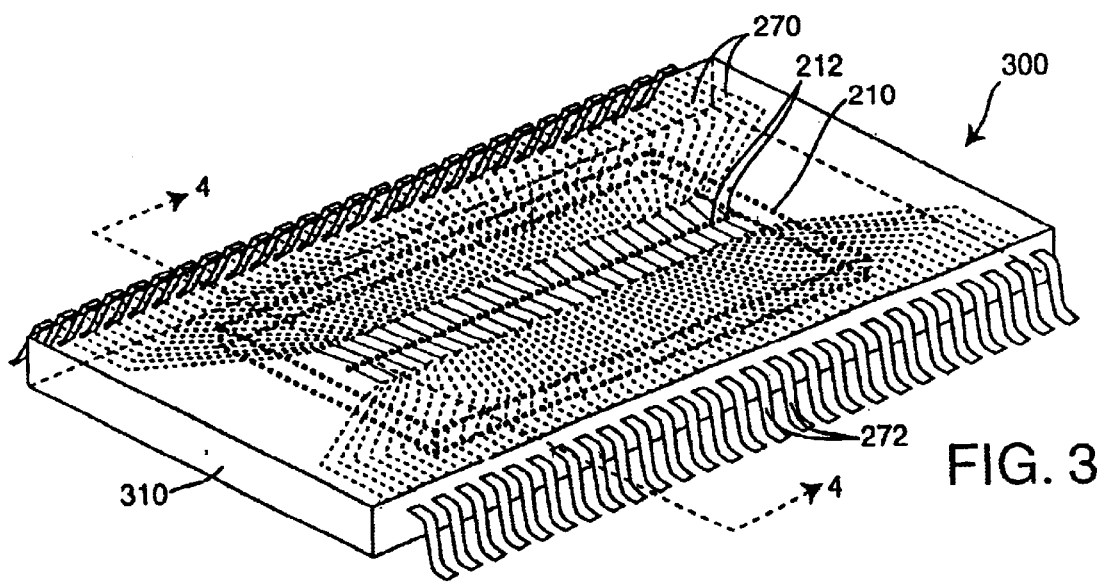
FIG. 3 is a perspective view of the PEM 300 of FIG. 2 showing the die 210 (dashed lines) and a lead frame 270 encapsulated therein.

As visually suggested by mentally moving the die 210 of FIG. 1 into the PEM 300 of FIG. 2, FIG. 3 shows that the die 210 is encapsulated inside of the PEM 300. In this particular case, the die's bond pads 212 are electrically connected to a lead frame 270 that is encapsulated along with the die 210 while providing the leads 272 that extend from the PEM's encapsulant 310.

FIGS. 4a to 4f are cross-sectional views that illustrate the steps of a preferred method of modifying the PEM 300 of FIG. 3 to first form a modified PEM 400 and ultimately to form a stackable microcircuit layer 400*. As shown in such figures, a first embodiment of the herein disclosed method of making a stackable microcircuit layer 400* comprising the steps of: providing a PEM 300 that includes (a) a microcircuit 210 having an active surface 211 containing integrated circuitry and a bond pad 212, and (b) an encapsulant 310 in contact with the microcircuit 210; and modifying the PEM 300 to produce a modified PEM 400 having a modified surface on which modified surface is exposed an end portion of a conductive member (e.g. a section of the ball bond 231 or a section of the wire 232) that is electrically connected to the bond pad 212.

Figure 4A:
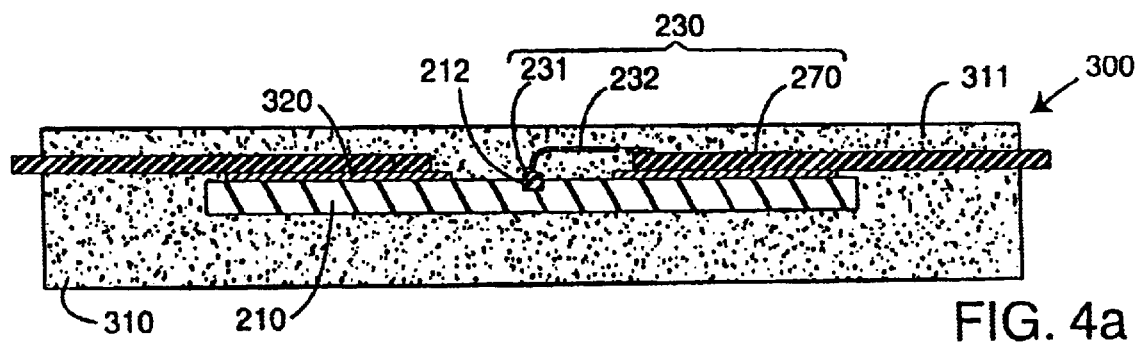
FIGS. 4a to 4f are cross-sectional views that illustrate the steps of a preferred method of modifying a PEM 300 to first form a modified PEM 400 and ultimately to form a stackable microcircuit layer 400* where, in particular.

FIG. 4a, in more detail, is a cross-sectional view of the PEM 300 of FIG. 3, taken along section lines 4—4, showing the internal die 210 and a conductive lead assembly 230 contained inside of the encapsulant 310. The conductive lead assembly 230 in this particular PEM 300 was formed by using a lead frame adhesive 320 (typically, in the case of a TSOP, a polymide adhesive layer that is located on either side of the bond pads 212) to secure a lead frame 270 above the die 210. In this particular case, moreover, a thermosonic ball bond process was used to connect the bond pads 212 to the lead frame 270. The precise manner of connection is not relevant to the present invention, but generally, as is well known in the art, a plurality of wires 232 are connected from each bond pad 212 to a corresponding portion of the lead frame 270 by first forming a gold ball 231 at one end of the wire 232, ultrasonically bonding the gold ball 231 to the bond pad 212, and then compressing the other end of the wire 212 to the lead frame 270 to form a so-called "crescent bond" on the lead frame. As further shown in FIG. 4a, the PEM's encapsulant 310, usually formed in an injection molding process, surrounds the die 210 and includes an upper portion 311 that covers the conductive lead assembly 230 (gold ball 231, wire 232, and lead frame 270).

Figure 4B:
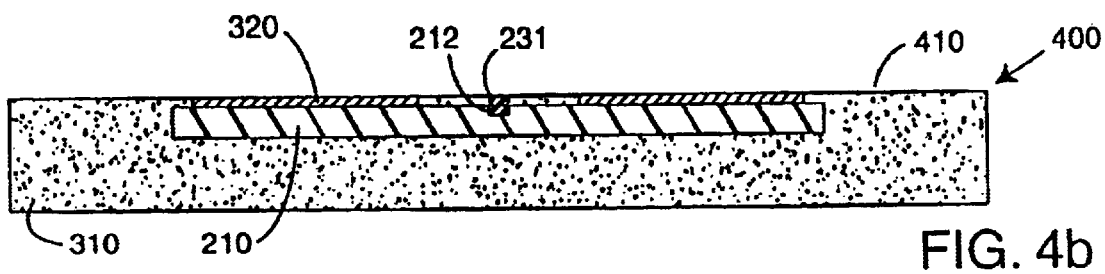

FIG. 4b relates to modifying the PEM 300, here by grinding or top thinning. Other alternatives could be used, of course, such as wet etching, dry etching as with a plasma, hand lapping with a diamond paste, and so on. FIG. 4b, in particular, shows a first preferred method of modifying the PEM 300 to form a modified PEM 400. Here, the PEM 300 is ground from the top through the lead frame 270 In other words, this modifying step is accomplished by grinding a topside of the PEM 300 of FIG. 4a in order to remove the lead frame 270, in order to expose an upper surface of the lead frame adhesive 320 that once secured the lead frame 270, and in order to expose a conductive member that is electrically connected to the bond pad 212 (e.g. a section of the wire 232 and/or a section of the gold ball bond 231). The presently preferred method of grinding involves using a Strausbaugh wafer grinder with the PEM mounted on a blank dummy wafer, but different grinding methods may be used.

Figure 4C:
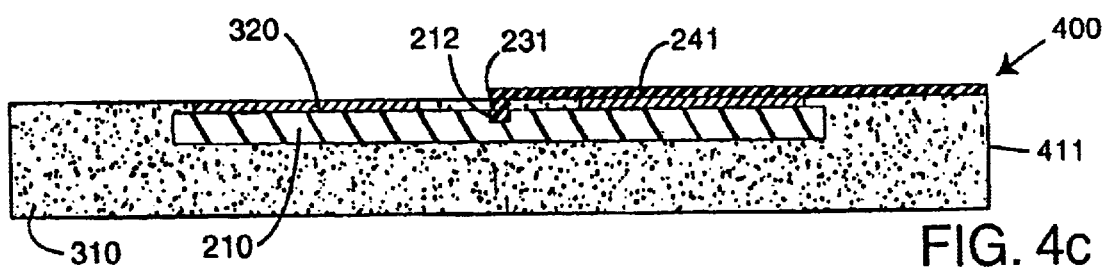

FIG. 4c relates to adding reroute metal by forming an electrical lead 241 on the modified surface of the modified PEM 400. FIG. 4c, in particular, shows the modified PEM 400 after application of metallization 241 that connects the die's bond pad 212, via the gold ball bond 231, with an edge 411 of the modified PEM 400. The processes used to lay down the reroute metaliization are well known. One such process, for example, involves sputtering on a field layer of metal, applying an emulsion and processing it to define the desired pattern; and then etching away the undesired portions of the field layer to leave only the desired metallization. The reroute metallization may be applied to each modified PEM 400, one at a time, or to several at a time by establishing a suitable gang processing procedure. It should be noted that in some applications it may be possible to retain the original lead frame 270 and not apply new reroute metal 24. This is particularly true for memory stacking applications where the access plane connections on the side of the stack are highly bused.

Figure 4D:
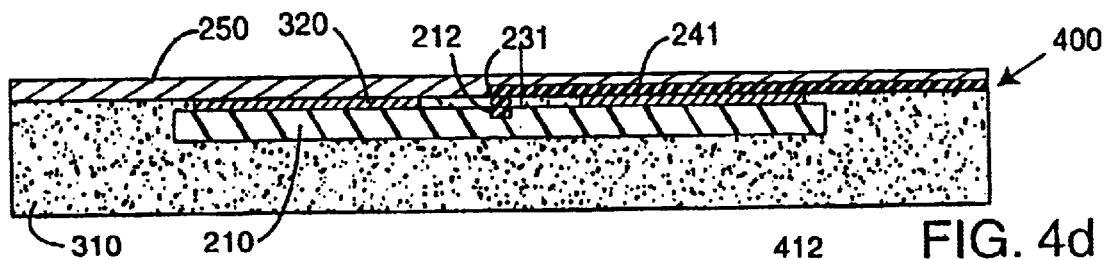

FIG. 4d relates to adding an insulating layer 250 that covers the electrical reroute lead 241. FIG. 4d, in particular, shows the modified PEM 400 after application of an insulating layer 250. The preferred insulating layer 250 is a polyimide that is spun on or sprayed on as desired.

Figure 4E:
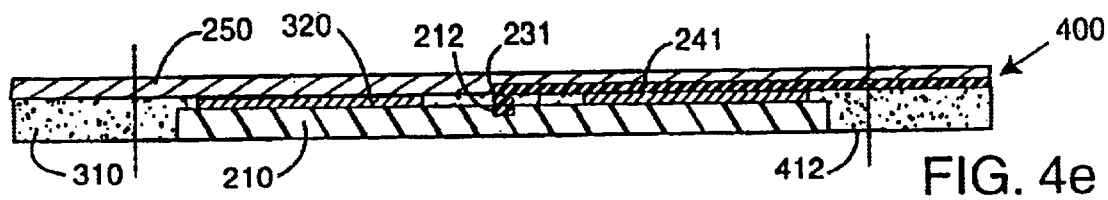

FIG. 4e relates to an optional back thinning step. FIG. 4e, in particular, shows the modified PEM 400 after such backside thinning. Backside thinning is particular desirable in the case of a TSOP because it makes the ultimate stackable microcircuit layer 400* thinner (about 10 mils in thickness), because it removes plastic that would otherwise be thermally insulative, and because it allow for tighter height tolerance that may prevent tolerance runout when connecting to separate electrically isolated leads in a stack of the microcircuit layers 400*.

Figure 4F:
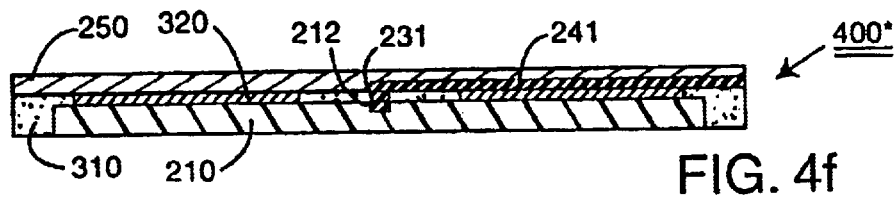

FIG. 4f relates to an optionally reducing the area of the modified PEM 500 by, in this case, dicing. FIG. 4f, in particular, shows the final stackable microcircuit layer 400\* that is formed by dicing the modified PEM 400 of FIG. 4e along the dashed lines. At this point, the stackable microcircuit layer 400\* is comparable to a Neo-Chip except that here the die 210 was provided as part of a PEM 300 and was likely burned-in by the manufacturer and here the die 210 is surrounded by a portion of the encapsulant 310 that was part of the original PEM 300 rather than by an after-added potting material such as epoxy.

Figure 5:
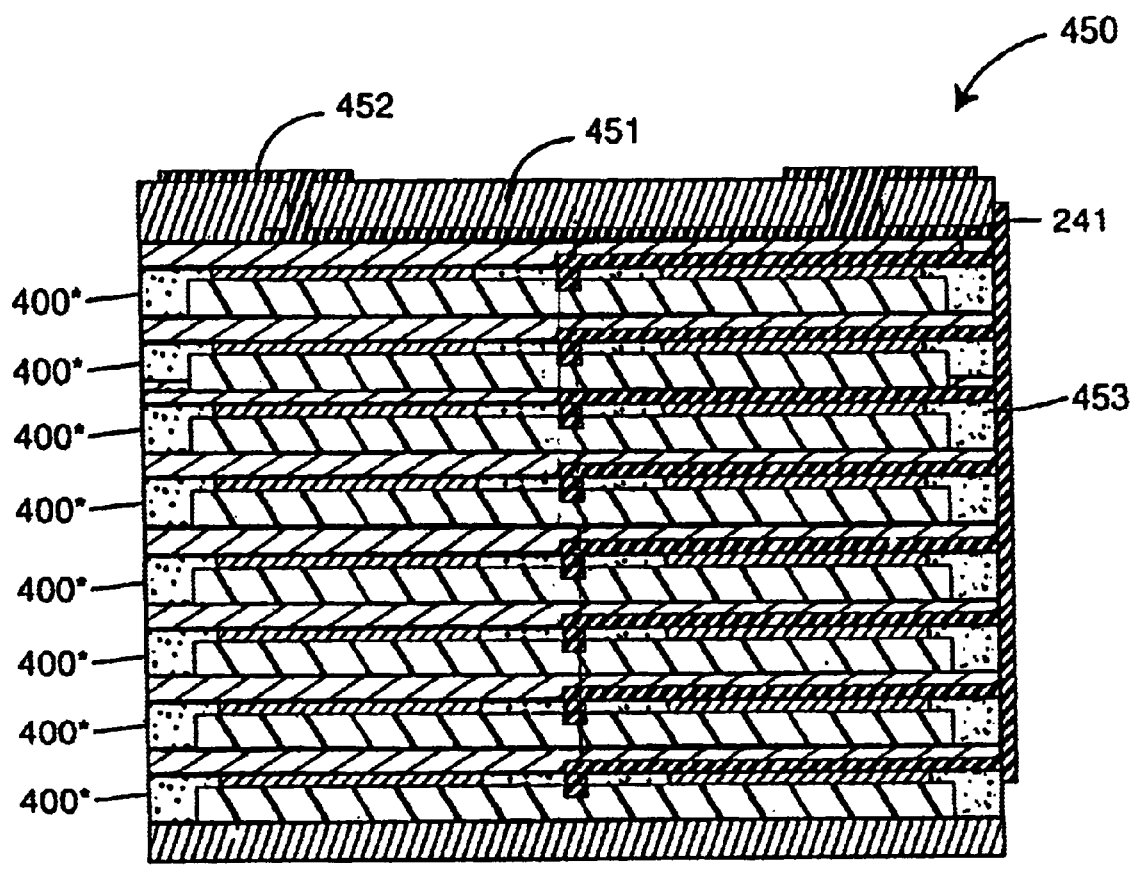
FIG. 5 shows a stack 450 of stackable microcircuit layers 400*, including a cap chip 451 that is electrically connected to metallization formed along an access plane of the stack.

FIG. 5 shows a typical stack 450 that may be formed from several stackable microcircuit layers 400\*, including a cap chip 451 that provides interface pads that are electrically connected to metallization 453 that is formed along an access plane of the stack 450 in order to provide so-called "t-connections" with the reroute metallization 241 (or original lead frames) of the individual layers 400\*. The preferred cap chip 451 is a printed circuit board, but it could be made from any suitable insulator (e.g. ceramic) that can be processed to provide the required via holes (not separately numbered). Here, the stack is homogenous, but it is also possible, of course, to produce stacks of equal or unequal area layers that contain different sized and differently numbers of die. It should also be noted that a stackable microcircuit layer 400\* may itself be further potted, alone or with other die, to create a neo-chip of greater area or enhanced capability.

Alternative Embodiment—$\mu$BGA Package

As suggested above, the present invention may be practiced with different types of packages and is not limited to plastic TSOPs. In order to illustrate this concept, the inventors also contemplate modifying a $\mu$BGA package in order to produce a stackable microcircuit layer.

Figure 6:
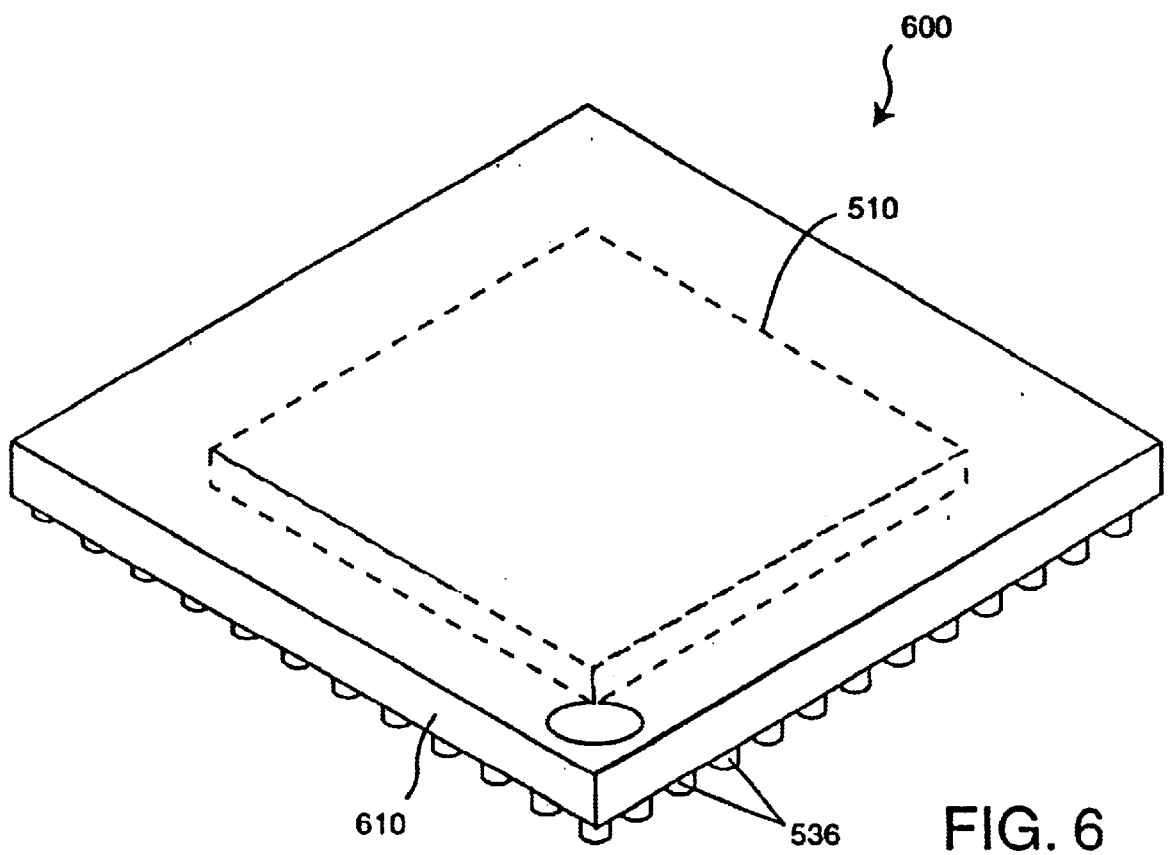
FIG. 6 is a perspective view of a plastic encapsulated microcircuit 600 provided as a Plastic Ball Grid Array (PBGA) package that is formed from an encapsulant 610 that contains a die 510 (dashed lines) that is electrically connected (not shown) to a plurality of solder ball terminals 536 arranged in a grid pattern.

FIG. 6, in particular, is a perspective view of a plastic encapsulated microcircuit 600 provided as a micro-Ball Grid Array ($\mu$BGA) package that is formed from an encapsulant 610 that contains a die 510 (dashed lines) that is electrically connected (not shown) to a plurality of solder ball terminals 536 arranged in a grid pattern on a bottom side of the package The application of the present invention to a PEM 600 in the form of a $\mu$BGA Package is illustrated by Figures FIGS. 7a to 7d.

Figure 7A:
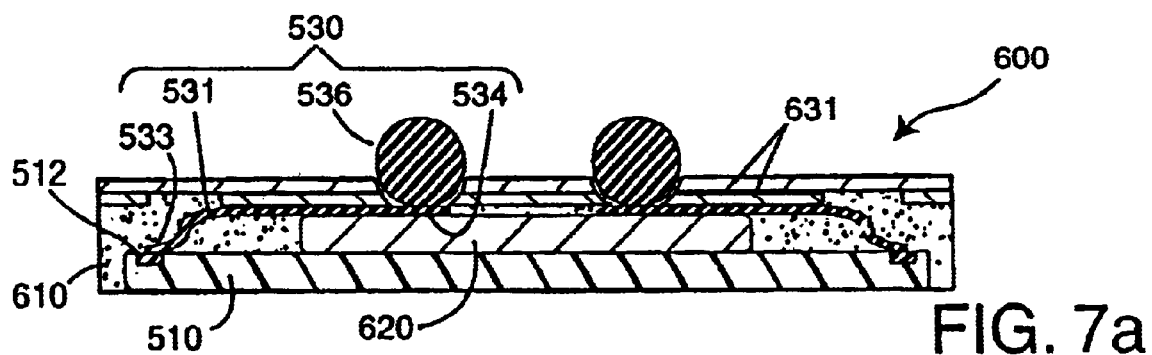
FIGS. 7a to 7d are cross-sectional views that illustrate the steps of a second preferred method of modifying a PEM, in this case a uBGA (micro Ball Grid Array) package 600, in order to form a modified PEM 700 and ultimately to form a stackable microcircuit layer 700* where, in particular.

FIG. 7a is our starting place in that it shows an inverted, cross-sectional view of the PEM 600 of FIG. 3 (simplified to show only two solder ball terminals 536). FIG. 7a shows that the die 510 and the conductive lead assembly 530 are contained inside of the encapsulant 610. There are some important differences, however, relative to the TSOP PEM 300.

The precise manufacture of the $\mu$BGA PEM 600 is well known, but a few observations as to its finished structure may help as related to this invention. Unlike the TSOP discussed above, the encapsulant 610 more closely conforms to the area of the die 510 (i.e. it is a "chip scale" package) and an inactive surface of the die 510 is exposed. The conductive lead assembly 530 also differs from that found in a TSOP. In particular, the $\mu$BGA PEM 600 includes a flexible lead beam 531 that is supported on an elastomeric pad 620 having one end adhered to the bond pad 512 and another end in contact with a deposited solder ball 536. The flexible lead beam 531 is typically formed from a conductive trace provided on a flexible substrate such as a polyimide film. A succession of insulating layers 631 are provided in the original manufacture of the PEM 600.

Figure 7B:
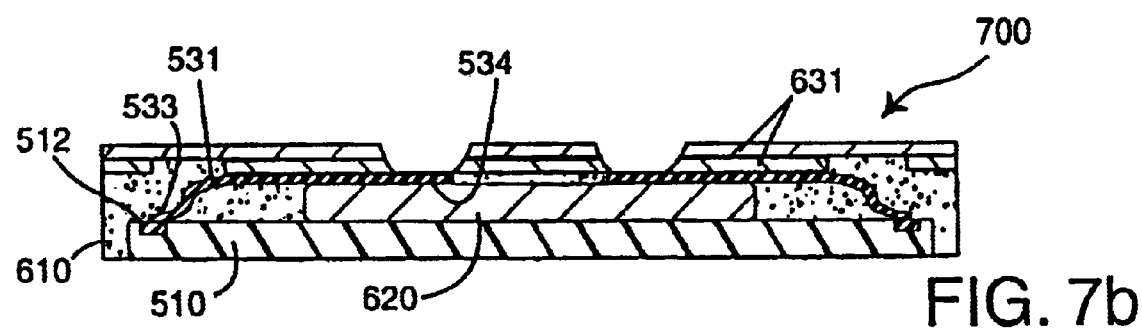

FIG. 7b, like FIG. 4b, relates to modifying the PEM. Here, however, the modifying or ablating is not accomplished by grinding or top thinning, but rather by removing at least a portion of the solder balls 536. In the preferred embodiment, the removing of at least a portion of the solder ball is accomplished by heating the solder ball to form molten solder and wicking away the molten solder. It may also be possible to remove a portion of the solder balls 536 through a mechanical shearing operation. FIG. 7b shows a modified PEM 700 formed by removing the solder balls 536 such that one end 534 of a flexible lead beam 531 is exposed.

Figure 7C:
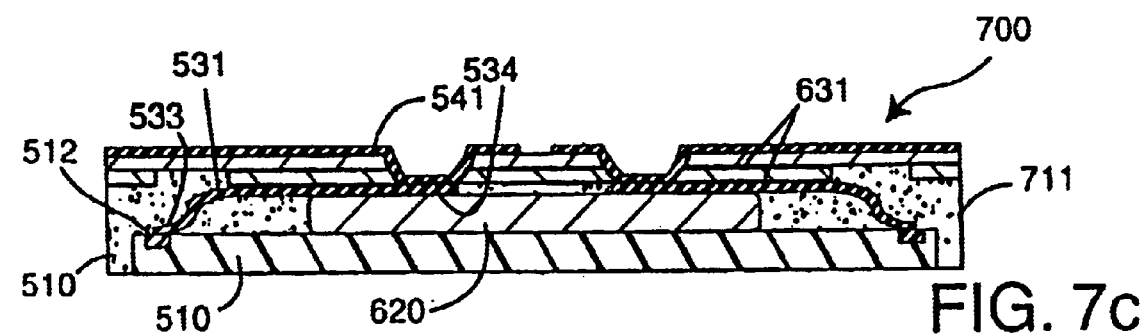
Figure 7D:
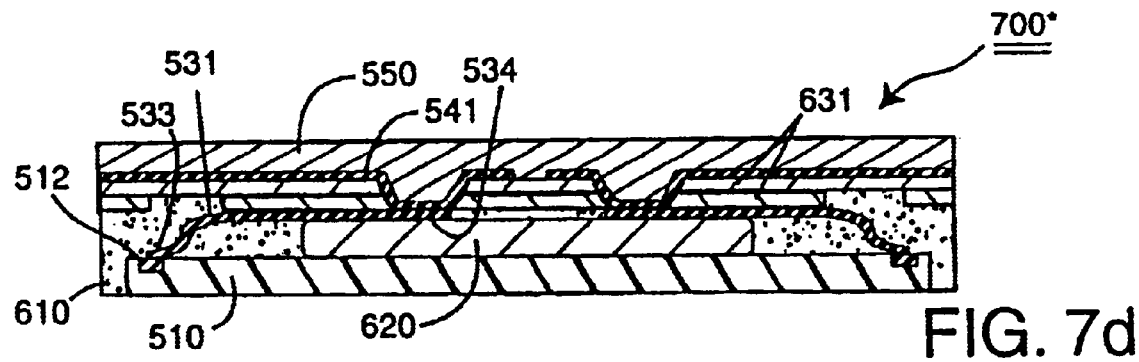

FIG. 7c, like FIG. 4c, relates to adding reroute metal by forming an electrical lead 541 on the modified surface of the modified PEM 700. FIG. 7c, in particular, shows the modified PEM 700 after application of reroute metallization 541 that connects the die's bond pad 512, via the flexible lead beam 531 that has one end 533 in contact with the bond pad 512 and another end 534 exposed to the metallization 543, with an edge 711 of the modified PEM 700; and FIG. 7d, like FIG. 4d, relates to adding an insulating layer 550 that covers the electrical reroute lead 541. At this point, the result is the final stackable microcircuit layer 700\*. There is no need for back thinning or reduction in area as in FIGS. 4e and 4f above because the uBGA was thin and chip scale to begin.

Figure 8:
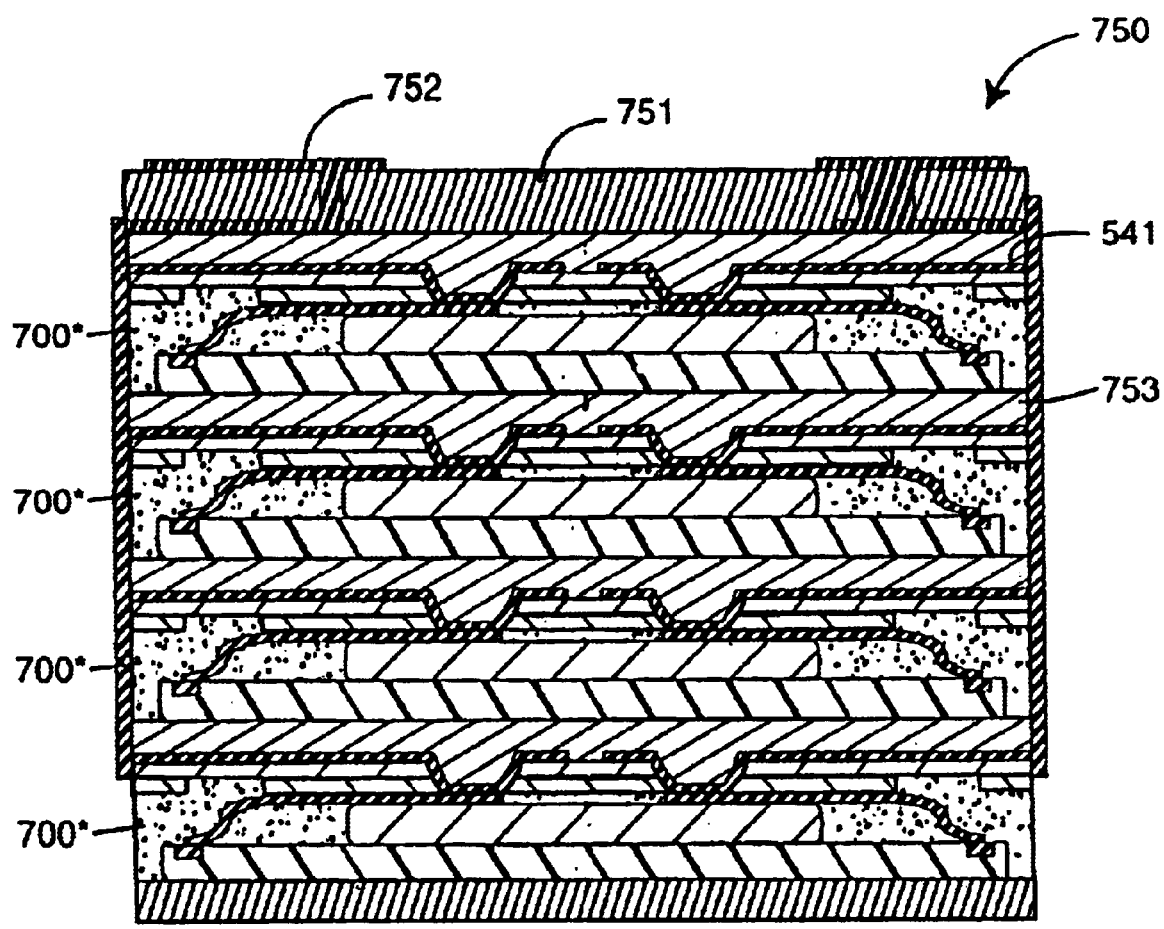
FIG. 8 shows a stack 750 of stackable microcircuit layers 700*, including a cap chip 751 that is electrically connected to metallization formed along an access plane of the stack.

FIG. 8 shows a typical stack 750 that may be formed from several stackable microcircuit layers 700\*, including a cap chip 751 that provides interface pads that are electrically connected to metallization 753 that is formed along an access plane of the stack 750 in order to provide so-called "t-connections" with the reroute metallization 541 of the individual layers 700\*. FIG. 8, of course, is comparable to FIG. 5.

As noted before, the stack 750 is shows as homogenous, but it is also possible, of course, to produce a stack of equal or unequal area layers that contain different sized and differently numbers of die. It should also be noted that a stackable microcircuit layer 700\* may itself be further potted, alone or with other die, to create a neo-chip of greater area or enhanced capability.

From the foregoing description, it will be apparent that the method and apparatus disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A stackable microcircuit layer comprising:
    (1) a core section of a plastic encapsulated microcircuit (PEM), said core section comprising
        (a) a microcircuit having a bond pad, (b) a conductive lead assembly connected to the bond pad,
        (c) a plastic body encapsulating the microcircuit, the bond pad, and the conductive lead assembly, and (d) an ablated surface
    on which ablated surface an exposed end portion of the conductive lead assembly is exposed; and
    (2) a reroute lead on the ablated surface of the core section to connect the exposed end portion of the conductive lead assembly with an edge of the core section.

2. The stackable microcircuit layer of claim 1 wherein the conductive lead assembly of the core section comprises a wire bond.

3. The stackable microcircuit layer of claim 2 wherein the exposed end portion of the conductive lead assembly is the wire bond.

4. The stackable microcircuit layer of claim 3 wherein the wire bond is exposed on the ablated surface by grinding.

5. The stackable microcircuit layer of claim 1 wherein the conductive lead assembly of the core section comprises a conductive trace.

6. The stackable microcircuit layer of claim 5 wherein the exposed end portion of the conductive lead assembly is the conductive trace.

* * * * *